United States Patent
Kodama

(10) Patent No.: US 10,976,374 B2
(45) Date of Patent: Apr. 13, 2021

(54) BATTERY INFORMATION PROCESSING SYSTEM, BATTERY ASSEMBLY, METHOD OF EVALUATING CHARACTERISTIC OF BATTERY MODULE, AND METHOD OF MANUFACTURING BATTERY ASSEMBLY

(71) Applicant: TOYOTA JIDOSHA KABUSHIKI KAISHA, Toyota (JP)

(72) Inventor: Kazuya Kodama, Tajimi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 16 days.

(21) Appl. No.: 16/392,788

(22) Filed: Apr. 24, 2019

(65) Prior Publication Data

US 2019/0331738 A1 Oct. 31, 2019

(30) Foreign Application Priority Data

Apr. 26, 2018 (JP) .............................. JP2018-084934

(51) Int. Cl.
*G01R 31/389* (2019.01)
*H01M 10/48* (2006.01)
*G01R 31/367* (2019.01)
*H01M 10/42* (2006.01)
*G01R 31/396* (2019.01)

(52) U.S. Cl.
CPC ......... *G01R 31/389* (2019.01); *G01R 31/367* (2019.01); *G01R 31/396* (2019.01); *H01M 10/4285* (2013.01); *H01M 10/482* (2013.01)

(58) Field of Classification Search
CPC .. G01R 31/389; G01R 31/367; G01R 31/396; G01R 31/3648; G01R 31/392; H01M 10/482; H01M 10/4285; H01M 10/48; H01M 2220/20

USPC .......... 324/426–437, 500, 520–524, 750.01, 324/750.16, 600, 612, 616, 629, 638–650, 324/76.11, 216
See application file for complete search history.

(56) References Cited

U.S. PATENT DOCUMENTS

| 2012/0286691 | A1* | 11/2012 | Jesme | ........................ | G06F 1/26 |
| | | | | | 315/250 |
| 2016/0190833 | A1* | 6/2016 | Roumi | ........................ | H02J 7/00 |
| | | | | | 320/136 |

FOREIGN PATENT DOCUMENTS

JP 2003-317810 A 11/2003

* cited by examiner

*Primary Examiner* — Melissa J Koval
*Assistant Examiner* — Trung Nguyen
(74) *Attorney, Agent, or Firm* — Sughrue Mion, PLLC

(57) ABSTRACT

A battery information processing system includes an analyzer configured to analyze a result of measurement of an AC impedance of a module M. The analyzer plots the result of measurement of the AC impedance on a first frequency characteristic diagram which is a Bode diagram (a first diagram) relating to a real number component of the AC impedance and on a second frequency characteristic diagram which is a Bode diagram (a second diagram) relating to an imaginary number component of the AC impedance, obtains a polynomial curve L1 by fitting processing onto a result of plotting on the first diagram and obtains a polynomial curve L2 by fitting processing onto a result of plotting on the second diagram, and converts the polynomial curves L1 and L2 into an impedance curve Z on a Nyquist diagram.

11 Claims, 11 Drawing Sheets

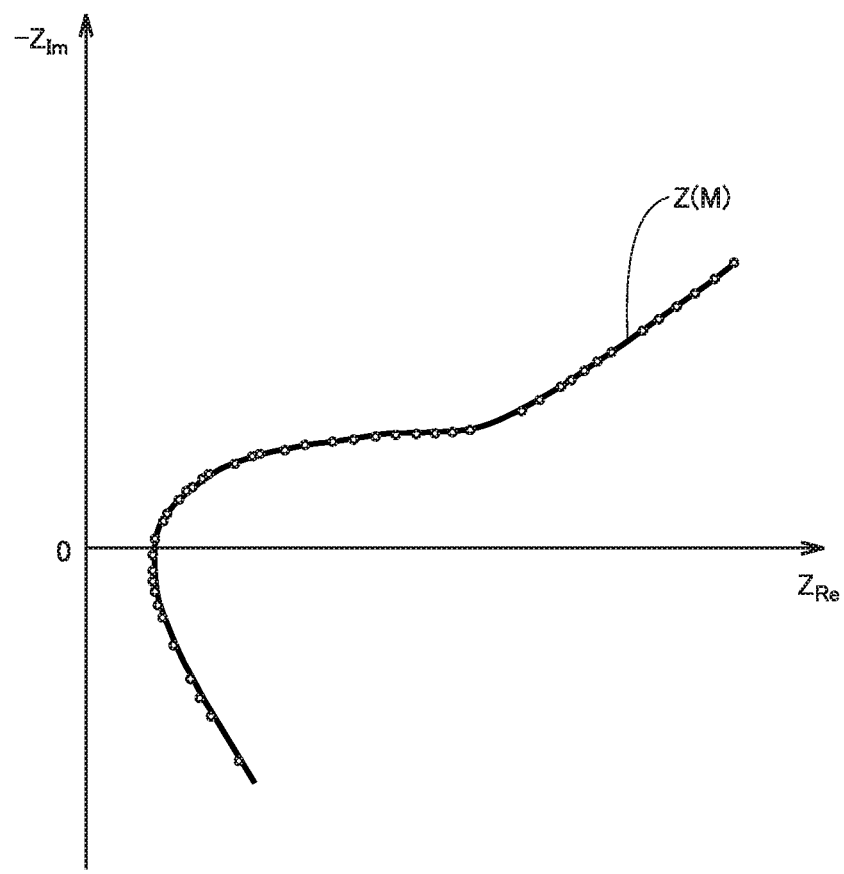

FIG.9

| SIGN | MODEL PARAMETER |
|---|---|
| L | JUNCTION INDUCTANCE |
| R | JUNCTION RESISTANCE |
| Rsol | SOLUTION RESISTANCE |
| Rct | CHARGE TRANSFER RESISTANCE |
| p1 | CPE INDEX OF DIFFUSION RESISTANCE |
| T1 | CPE CONSTANT OF DIFFUSION RESISTANCE |
| p2 | CPE INDEX OF ELECTRIC DOUBLE LAYER CAPACITANCE |
| T2 | CPE CONSTANT OF ELECTRIC DOUBLE LAYER CAPACITANCE |

COMPARATIVE EXAMPLE

PRESENT EMBODIMENT

BATTERY INFORMATION PROCESSING SYSTEM, BATTERY ASSEMBLY, METHOD OF EVALUATING CHARACTERISTIC OF BATTERY MODULE, AND METHOD OF MANUFACTURING BATTERY ASSEMBLY

This nonprovisional application is based on Japanese Patent Application No. 2018-084934 filed with the Japan Patent Office on Apr. 26, 2018, the entire contents of which are hereby incorporated by reference.

BACKGROUND

Field

The present disclosure relates to a battery information processing system, a battery assembly, a method of evaluating a characteristic of a battery module, and a method of manufacturing a battery assembly, and more particularly to an information processing technique for evaluating a characteristic such as an internal resistance or a full charge capacity of a battery module including a plurality of secondary batteries.

Description of the Background Art

Electrically powered vehicles incorporating secondary batteries (more specifically, a battery assembly including a plurality of secondary batteries) have increasingly been used in recent years. A secondary battery deteriorates with repeated charging and discharging or with lapse of time. Therefore, secondary batteries mounted on vehicles should be collected, a degree of progress of deterioration thereof should be diagnosed, and appropriate processing for recycle in accordance with results of diagnosis should be performed.

An alternating-current (AC) impedance measurement method has been known as an approach to diagnosis of a degree of progress of deterioration of a secondary battery. For example, Japanese Patent Laying-Open No. 2003-317810 discloses a method of determining whether or not minor short-circuiting has occurred in a secondary battery based on a reaction resistance value of the secondary battery obtained by the AC impedance measurement method.

SUMMARY

A general battery assembly to be mounted on a vehicle includes a plurality of battery modules. Each battery module includes a plurality of secondary batteries (cells). For example, in determining recyclability of a battery assembly to be mounted on a vehicle, battery modules are taken out of a collected battery assembly. Then, an AC impedance of each battery module is measured and recyclability of each battery module is determined based on a result of measurement.

In the AC impedance measurement method, an AC signal at a frequency within a prescribed range is successively applied to a battery module and a response signal from the battery module at that time is measured. A real number component and an imaginary number component of an impedance of the battery module are calculated from the applied AC signal (an application signal) and the measured response signal, and results of calculation are discretely plotted on a complex plane. This complex plane is also called a Nyquist diagram. By analyzing a result of plotting on the Nyquist diagram, various characteristics such as a full charge capacity and an internal resistance value of the battery module can be evaluated (tested or estimated). This analysis approach will briefly be described (details of which will be described later).

Initially, an equivalent circuit model which matches with frequency characteristics of a battery module to be analyzed is constructed and an impedance of the battery module is expressed with a plurality of circuit constants (a model parameter such as a resistance component, a capacitance component, and an inductance component of the battery module) included in that equivalent circuit model. Values of the plurality of circuit constants are calculated by performing curve fitting to decrease an error from a result of measurement (discrete measurement data) of the impedance of the battery module. Correlation between the plurality of circuit constants and a characteristic of the battery module is found in preliminary experiments. Therefore, the characteristic of the battery module can be evaluated based on values of the plurality of circuit constants corresponding to the battery module to be analyzed.

In general, when a battery module is charged or discharged and a state of charge (SOC) is considerably varied during measurement of an AC impedance of a secondary battery, accuracy in measurement of the AC impedance of the secondary battery may lower, because various characteristics such as a full charge capacity may be SOC dependent.

In view of this aspect, a sufficiently small value is set for an amplitude of an alternating-current (AC) signal (an application signal) to be applied to a battery module. Variation in SOC of the battery module can thus be suppressed and lowering in accuracy in measurement of an AC impedance due to SOC dependency of characteristics can be suppressed. On the other hand, with decrease in amplitude of the application signal, a signal-to-noise ratio (an S/N ratio) between the application signal and noise is lowered. Consequently, accuracy in measurement of an AC impedance may lower.

The present disclosure was made to solve the problems above, and an object thereof is to provide a technique allowing improvement in accuracy in evaluating characteristics of a battery module based on a result of measurement of an AC impedance of the battery module.

(1) A battery information processing system according to one aspect of the present disclosure processes information on a characteristic of a battery module including a plurality of secondary batteries. The battery information processing system includes an analyzer and a storage. The analyzer is configured to analyze a result of measurement of an AC impedance of the battery module under such a condition that a value of a current applied to the battery module is smaller than a defined value. The storage is configured to store correlation between a plurality of circuit constants included in an equivalent circuit model expressing the AC impedance of the battery module and the characteristic. The analyzer is configured to plot the result of measurement of the AC impedance of the battery module on a first frequency characteristic diagram and a second frequency characteristic diagram, the first frequency characteristic diagram being a Bode diagram relating to a real number component of the AC impedance of the battery module, and the second frequency characteristic diagram being a Bode diagram relating to an imaginary number component of the AC impedance of the battery module. The analyzer is configured to obtain a first polynomial curve by fitting processing onto a result of plotting on the first frequency characteristic diagram and obtain a second polynomial curve by fitting processing onto a result of plotting on the second frequency characteristic diagram. The analyzer is configured to convert the first and second polynomial curves into an impedance curve on a Nyquist diagram by deleting, for example, a frequency as a parameter from the first polynomial curve on the first frequency characteristic diagram and the second polynomial curve on the second frequency characteristic diagram. The analyzer is configured to extract the plurality of circuit constants from the impedance curve and evaluate the characteristic based on the plurality of extracted circuit constants by referring to the correlation.

(2) Preferably, each of the plurality of secondary batteries is a nickel metal hydride battery. The characteristic of the battery module is at least one of a full charge capacity and an internal resistance of the battery module.

The result of measurement of the AC impedance may also be analyzed on a Nyquist diagram. Specifically, the result of measurement of the AC impedance may also be plotted on a Nyquist diagram and values of a plurality of circuit constants may be calculated by subjecting a result of plotting to curve fitting. In this case, however, the result of plotting on which noise has been superimposed is subjected to curve fitting on the Nyquist diagram, and therefore influence by noise may appear in values of the plurality of circuit constants.

In contrast, according to the features in (1) and (2), initially, a result of measurement of the AC impedance is plotted on a Bode diagram and a result of plotting is subjected to curve fitting so that first and second polynomial curves are obtained on the Bode diagram. By deleting a frequency from the first and second polynomial curves, an impedance curve on a Nyquist diagram is obtained and a plurality of circuit constants are extracted from the thus obtained impedance curve. Thus, influence by noise is lessened by curve fitting on the Bode diagram (the reason will be described later) and an impedance curve on the Nyquist diagram is calculated. Therefore, influence by noise on values of the plurality of circuit constants is lessened. Therefore, according to the features in (1) and (2), characteristics of a battery module can highly accurately be evaluated based on a result of measurement of an AC impedance of the battery module.

(3) A battery assembly according to another aspect of the present disclosure includes a plurality of battery modules of which characteristic has been evaluated by the battery information processing system described above.

According to the feature in (3), a battery assembly is constituted of battery modules of which characteristic has highly accurately been evaluated by the features in (1) and (2). Therefore, for example, a battery assembly less in variation in characteristic (such as variation in full charge capacity) among battery modules can be provided.

(4) A method of evaluating a characteristic of a battery module according to yet another aspect of the present disclosure evaluates a characteristic of a battery module including a plurality of secondary batteries. Correlation between the characteristic and a plurality of circuit constants included in an equivalent circuit model expressing an AC impedance of the battery module is established. The method of evaluating a characteristic of a battery module includes first to fourth steps. The first step is a step of plotting a result of measurement of the AC impedance of the battery module under such a condition that a value of a current applied to the battery module is smaller than a defined value on a first frequency characteristic diagram and a second frequency characteristic diagram, the first frequency characteristic diagram being a Bode diagram relating to a real number component of the AC impedance of the battery module, and the second frequency characteristic diagram being a Bode diagram relating to an imaginary number component of the AC impedance of the battery module. The second step is a step of obtaining a first polynomial curve by fitting processing onto a result of plotting on the first frequency characteristic diagram and obtaining a second polynomial curve by fitting processing onto a result of plotting on the second frequency characteristic diagram. The third step is a step of converting the first and second polynomial curves into an impedance curve on a Nyquist diagram. The fourth step is a step of extracting the plurality of circuit constants from the impedance curve and evaluating the characteristic based on the plurality of extracted circuit constants by referring to the correlation.

According to the method in (4), as in the features in (1), characteristics of a battery module can highly accurately be evaluated by analyzing a result of measurement of the AC impedance of the battery module.

(5) Correlation between a plurality of circuit constants included in an equivalent circuit model expressing an AC impedance of a battery module including a plurality of secondary batteries and a characteristic of the battery module is established. A method of manufacturing a battery assembly according to yet another aspect of the present disclosure includes first to fifth steps. The first step is a step of plotting a result of measurement of the AC impedance of the battery module under such a condition that a value of a current applied to the battery module is smaller than a defined value on a first frequency characteristic diagram and a second frequency characteristic diagram, the first frequency characteristic diagram being a Bode diagram relating to a real number component of the AC impedance of the battery module, and the second frequency characteristic diagram being a Bode diagram relating to an imaginary number component of the AC impedance of the battery module. The second step is a step of obtaining a first polynomial curve by fitting processing onto a result of plotting on the first frequency characteristic diagram and obtaining a second polynomial curve by fitting processing onto a result of plotting on the second frequency characteristic diagram. The third step is a step of converting the first and second polynomial curves into an impedance curve on a Nyquist diagram. The fourth step is a step of extracting the plurality of circuit constants from the impedance curve and evaluating the characteristic based on the plurality of extracted circuit constants by referring to the correlation. The fifth step is a step of manufacturing the battery assembly from a plurality of battery modules of which characteristic has been evaluated in the evaluating the characteristic.

According to the manufacturing method in (5), as in the feature in (3), a battery assembly can be manufactured from battery modules of which characteristic has highly accurately been evaluated.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 7 is a diagram showing one example of an impedance curve on a Nyquist diagram.

FIG. 9 is a diagram for illustrating a circuit constant included in the equivalent circuit model shown in FIG. 8.

DESCRIPTION OF THE PREFERRED EMBODIMENTS

Figure 1:
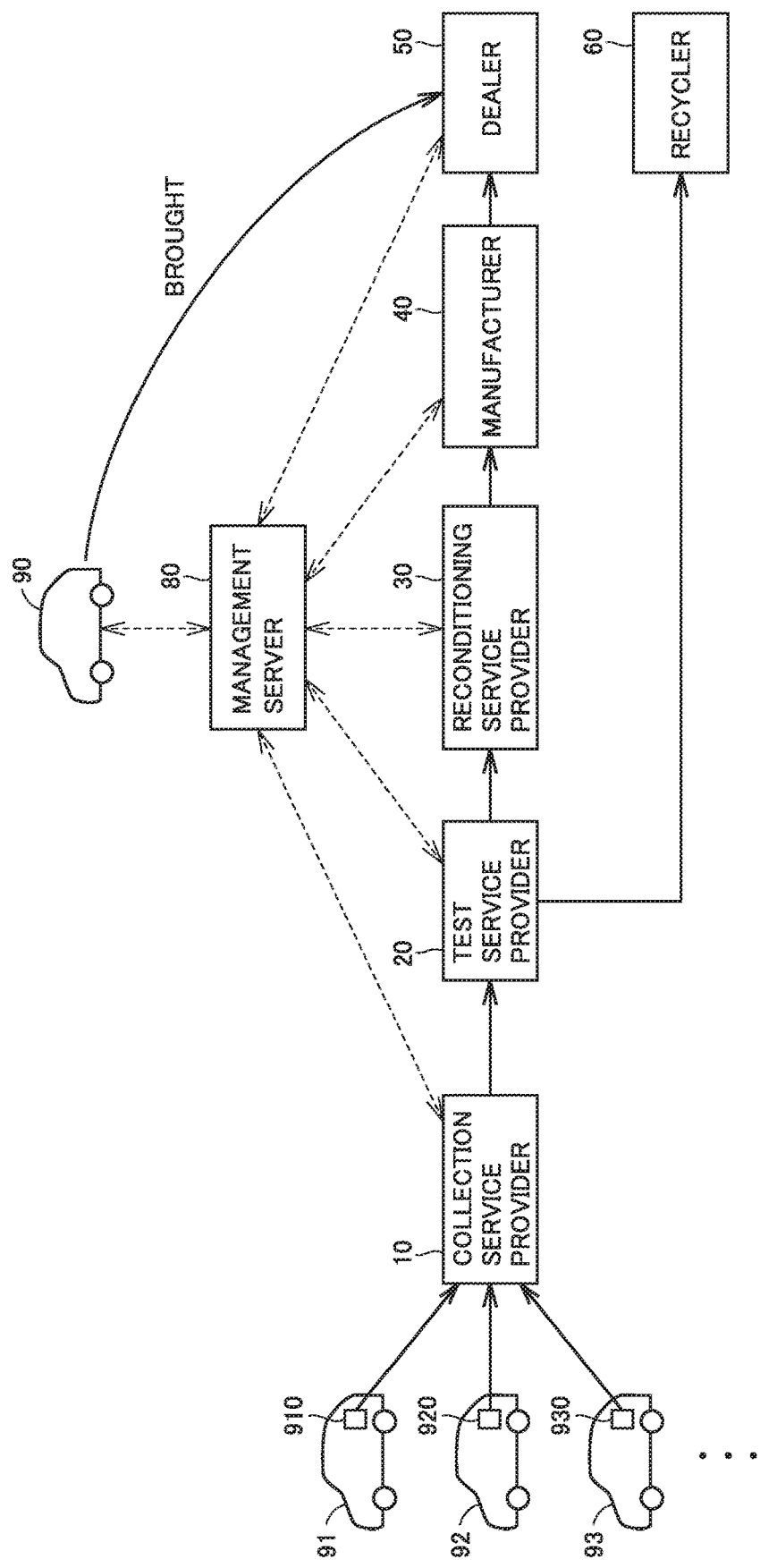
FIG. 1 is a diagram showing one manner of distribution from collection to manufacturing and sales of battery assemblies in the present embodiment.

An embodiment of the present disclosure will be described below in detail with reference to the drawings. The same or corresponding elements in the drawings have the same reference characters allotted and description thereof will not be repeated.

In the present disclosure, a battery assembly includes a plurality of battery modules (a battery module being abbreviated as a "module" below). The plurality of modules may be connected in series or in parallel. Each of the plurality of modules includes a plurality of secondary batteries (a secondary battery being denoted as a "cell" below) connected in series.

"Manufacturing" of a battery assembly in the present disclosure means manufacturing of a battery assembly by replacing at least one of a plurality of modules included in a battery assembly with replacement modules. Though the replacement module is basically a recyclable module taken out of a collected battery assembly, it may be a new module.

In general, "recycle" of a battery assembly is broadly categorized into reuse, rebuild, and resource recycle. In the case of reuse, collected battery assemblies are subjected to necessary shipment inspection and shipped as they are as reuse products. In the case of rebuild, collected battery assemblies are once disassembled to modules (which may be cells). Then, among the disassembled modules, modules which can be used after reconditioning (which may be modules which can be used as they are) are combined to manufacture a new battery assembly. Newly manufactured battery assemblies are subjected to shipment inspection and shipped as rebuilt products. In resource recycle (material recycle), renewable materials are taken out of each module (each cell) and collected battery assemblies are not used as other battery assemblies.

In the embodiment described below, a battery assembly collected from a vehicle is once disassembled into modules and a performance test is conducted for each module. A battery assembly is manufactured from modules determined as being recyclable as a result of the performance test. Therefore, a recyclable module means a rebuildable module below. Depending on a configuration of a battery assembly, however, a battery assembly as it is can also be subjected to the performance test without being disassembled into modules. "Recycle" in such a case may encompass both of reuse and rebuild.

In the present embodiment, each cell is implemented by a nickel metal hydride battery. More specifically, a positive electrode is composed of nickel hydroxide ($Ni(OH)_2$) to which a cobalt oxide additive is added. A negative electrode is composed of a hydrogen storage alloy (based on $MnNi_5$ which represents a nickel-based alloy). An electrolyte solution is composed of potassium hydroxide (KOH). These, however, are merely by way of example of a specific cell configuration, and a cell configuration is not limited thereto.

EMBODIMENT

Battery Distribution Model

Figure 2:
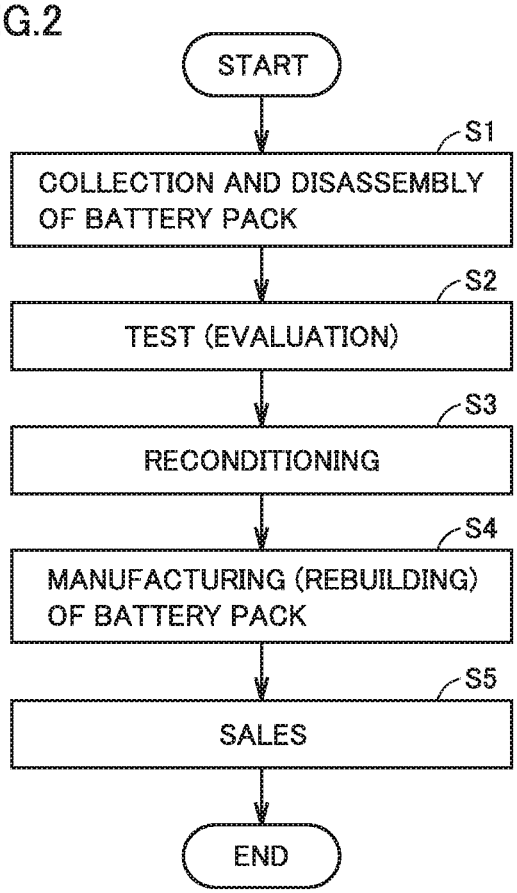
FIG. 2 is a flowchart showing a flow of processing in a battery distribution model shown in FIG. 1.

FIG. 1 is a diagram showing one manner of distribution from collection to manufacturing and sales of battery assemblies in the present embodiment. A manner of distribution shown in FIG. 1 is referred to as a "battery distribution model" below. FIG. 2 is a flowchart showing a flow of processing in the battery distribution model shown in FIG. 1.

Referring to FIGS. 1 and 2, in the battery distribution model, used battery assemblies are collected from a plurality of vehicles each incorporating battery assemblies, and battery assemblies are manufactured from recyclable modules included in the collected battery assemblies and then sold. A battery assembly mounted on a vehicle 90 of a certain user is replaced.

A collection service provider 10 collects used battery assemblies from vehicles 91 to 93. Battery assemblies 910 to 930 are mounted on vehicles 91 to 93, respectively. Though FIG. 1 shows only three vehicles due to space restriction, battery assemblies are actually collected from a larger number of vehicles. Collection service provider 10 further disassembles the collected battery assemblies and takes out a plurality of modules from the battery assemblies (step S1, hereinafter the step being abbreviated as "S").

In this battery distribution model, identification information (ID) for identifying a module is provided for each module, and a management server 80 manages information on each module. Therefore, collection service provider 10 transmits an ID of each module taken out of a battery assembly to management server 80 through a terminal device 71 (see FIG. 3).

A test service provider 20 tests performance of each module collected by collection service provider 10 (S2). Specifically, test service provider 20 tests electrical characteristics of the collected module. For example, test service provider 20 tests such electrical characteristics as a full charge capacity, a resistance value, an open circuit voltage (OCV), and a state of charge (SOC). Then, test service provider 20 classifies the modules into recyclable modules and non-recyclable modules based on results of the test, passes the recyclable modules to a reconditioning service provider 30 and the non-recyclable modules to a recycler 60. A test result of each module is transmitted to management server 80 through a terminal device 72 (see FIG. 3) of test service provider 20.

Reconditioning service provider 30 performs a process for reconditioning the module determined as recyclable by test service provider 20 (S3). By way of example, reconditioning service provider 30 restores a full charge capacity of the module by charging the module to an overcharged state. For a module determined as less in lowering in performance in the test by test service provider 20, reconditioning service provider 30 does not have to perform the reconditioning process. A result of reconditioning of each module is transmitted to management server 80 through a terminal device 73 (see FIG. 3) of reconditioning service provider 30.

A manufacturer 40 manufactures a battery assembly from modules reconditioned by reconditioning service provider 30 (S4). In the present embodiment, information (assembly information) for manufacturing a battery assembly is generated by management server 80 and transmitted to a terminal device 74 (see FIG. 3) of manufacturer 40. Manufacturer 40 manufactures (rebuilds) a battery assembly of vehicle 90 by replacing a module included in the battery assembly of vehicle 90 in accordance with the assembly information.

A dealer 50 sells the battery assembly manufactured by manufacturer 40 for vehicle use or for stationary use in a house or the like (S5). In the present embodiment, vehicle 90 is brought to dealer 50 and dealer 50 replaces the battery assembly of vehicle 90 with a reuse product or a rebuilt product manufactured by manufacturer 40.

Recycler 60 disassembles modules determined as being non-recyclable by test service provider 20 for reclamation for use as new cells or as source materials for other products.

Though collection service provider 10, test service provider 20, reconditioning service provider 30, manufacturer 40, and dealer 50 are service providers different from one another in FIG. 1, classification of the service providers is not limited as such. For example, a single service provider may serve as test service provider 20 and reconditioning service provider 30. Alternatively, collection service provider 10 may be divided into a service provider which collects battery assemblies and a service provider which disassembles collected battery assemblies. Locations of each service provider and each dealer are not particularly limited. Locations of each service provider and each dealer may be different or a plurality of service providers or dealers may be located at the same place.

Figure 3:
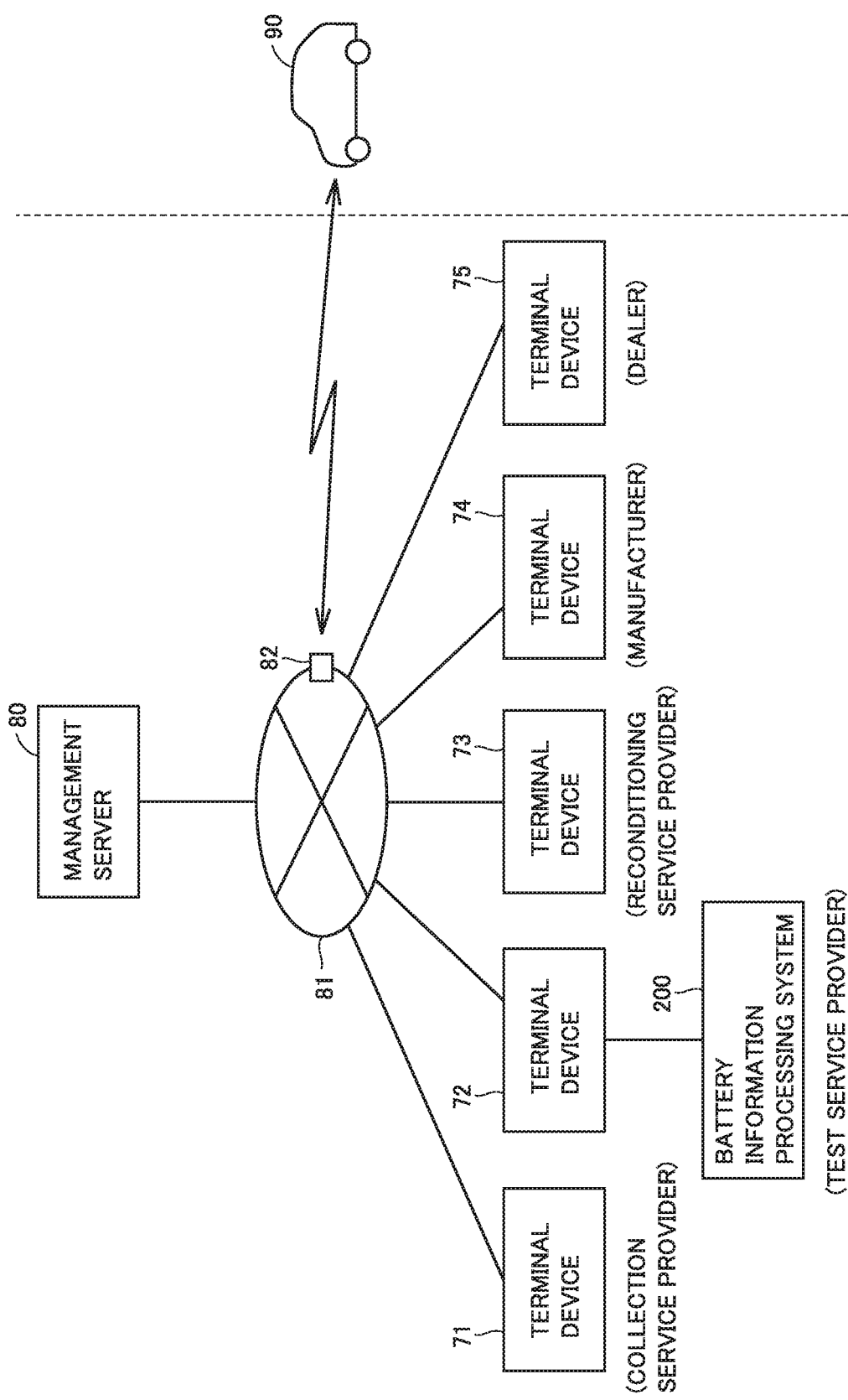
FIG. 3 is a diagram showing an exemplary configuration of a battery management system applied to the battery distribution model shown in FIG. 1.

FIG. 3 is a diagram showing an exemplary configuration of a battery management system applied to the battery distribution model shown in FIG. 1. Referring to FIG. 3, a battery management system 100 includes terminal devices 71 to 75, a management server 80, a communication network 81, and a base station 82.

Terminal device 71 is a terminal device of collection service provider 10. Terminal device 72 is a terminal device of test service provider 20. Terminal device 73 is a terminal device of reconditioning service provider 30. Terminal device 74 is a terminal device of manufacturer 40. Terminal device 75 is a terminal device of dealer 50.

Management server 80 and terminal devices 71 to 75 are configured to be able to communicate with one another through communication network 81 such as the Internet or telephone lines. Base station 82 on communication network 81 is configured to be able to transmit and receive information to and from vehicle 90 through wireless communication.

In test service provider 20, a battery information processing system 200 for measuring an AC impedance of each module and determining a manner of recycle (rebuild and resource recycle) of the module based on a result of measurement is provided. The manner of recycle of the module determined by battery information processing system 200 is transmitted to management server 80, for example, through terminal device 72.

A situation in which a manner of recycle of a certain module (which is denoted as a "module M") among a plurality of modules included in battery assembly 910 taken out of vehicle 91 is determined by battery information processing system 200 will be described below. Though an example in which a full charge capacity of module M is evaluated as a representative characteristic of module M is described, a characteristic of the module other than the full charge capacity (for example, an internal resistance) may be evaluated. Alternatively, both of a full charge capacity and an internal resistance can also be evaluated.

Functional Block of Battery Information Processing System

Figure 4:
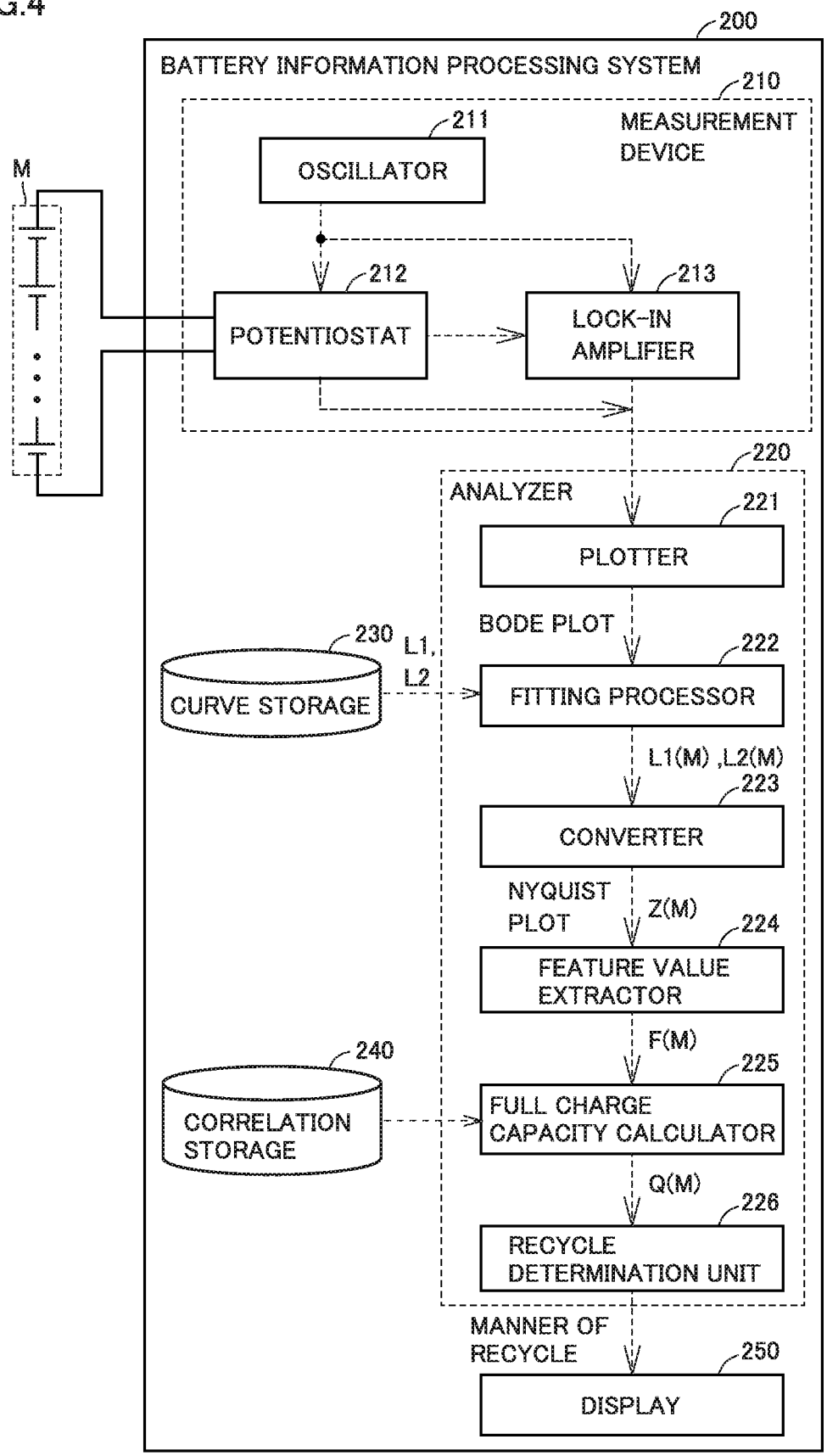
FIG. 4 is a diagram for illustrating a configuration of a battery information processing system.

FIG. 4 is a diagram for illustrating a configuration of battery information processing system 200. Referring to FIG. 4, battery information processing system 200 includes a measurement device 210, an analyzer 220, a curve storage 230, a correlation storage 240, and a display 250. These devices may be configured as devices independent of one another or as a single device.

Measurement device 210 measures an AC impedance of module M and outputs a result of measurement to analyzer 220. More specifically, measurement device 210 includes an oscillator 211, a potentiostat 212, and a lock-in amplifier 213.

Oscillator 211 outputs sinusoidal waves identical in phase to potentiostat 212 and lock-in amplifier 213.

Potentiostat 212 generates an application signal by superimposing a prescribed direct-current (DC) voltage on an AC voltage (for example, a voltage at an amplitude around 10 mV) identical in phase to sinusoidal waves from oscillator 211 and applies the generated application signal to module M. Then, potentiostat 212 detects a current which flows through module M and outputs a result of detection to lock-in amplifier 213 as a response signal from module M. Potentiostat 212 outputs the application signal and the response signal to a plotter 221.

Lock-in amplifier 213 compares a phase of the sinusoidal waves received from oscillator 211 with a phase of the response signal detected by potentiostat 212 and outputs a result of comparison (a phase difference between the sinusoidal waves and the response signal) to analyzer 220.

In measurement device 210, a frequency of sinusoidal waves output from oscillator 211 is swept in a prescribed frequency range and processing above is repeatedly performed by potentiostat 212 and lock-in amplifier 213. Thus, results of measurement of an AC impedance of module M for each frequency of sinusoidal waves are obtained.

The configuration of measurement device 210 is not limited to the configuration shown in FIG. 4. For example, though description that an AC voltage is applied to module M and a current which flows through module M at that time is detected has been given, potentiostat 212 may detect a voltage response at the time of application of an AC current to module M. Measurement device 210 may include a frequency response analyzer (not shown) instead of lock-in amplifier 213.

An approach below can also be adopted as an approach to measurement of an AC impedance. Specifically, an application signal (one of a voltage signal and a current signal) including various frequency components within a prescribed frequency range is generated, and a response signal (the other of the voltage signal and the current signal) at the time of application of the application signal is detected. Each of the application signal and the response signal is subjected to fast Fourier transform (FFT) for frequency decomposition, to thereby calculate an AC impedance for each frequency. An AC impedance of module M may be measured by such an approach.

Nyquist Plot

A result of measurement of an AC impedance of module M by measurement apparatus 210 may also be plotted on a Nyquist diagram (Nyquist plotting may be performed). In Nyquist plotting, a result of measurement of an AC impedance of module M in accordance with a frequency of an application signal is plotted on a complex plane as a discrete value.

Figure 5:
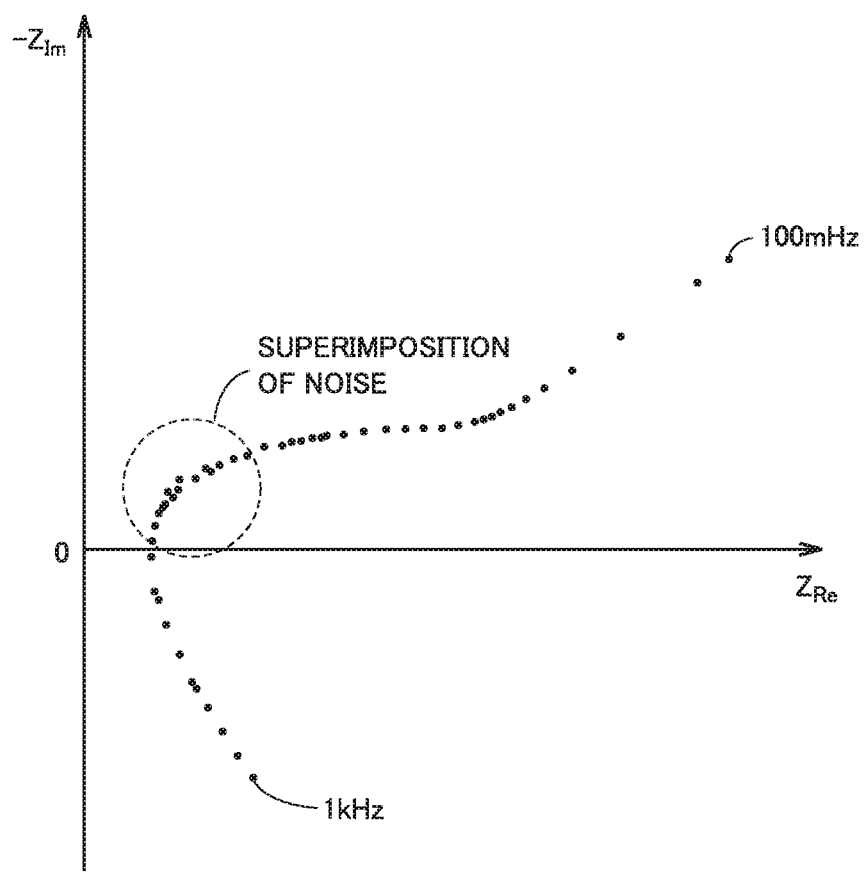
FIG. 5 is a diagram showing one example of a Nyquist plot of a result of measurement of an AC impedance of a module.

FIG. 5 is a diagram showing one example of a Nyquist plot of a result of measurement of an AC impedance of module M. In FIG. 5 and FIG. 7 which will be described later, the abscissa represents a real number component (real part) $Z_{Re}$ of a complex impedance of module M and the ordinate represents an imaginary number component (imaginary part) $-Z_{Im}$ of the complex impedance of module M.

FIG. 5 shows one example of a result of measurement of an AC impedance of module M when a frequency of an application signal is swept within a frequency region from 100 mHz to 1 kHz. A discrete measurement value of an AC impedance on such a Nyquist diagram may also be subjected to fitting processing to calculate a full charge capacity of module M based on a curve (an impedance collinear line) obtained by fitting processing.

In general, when a battery module is charged or discharged and an SOC is considerably varied during measurement of an AC impedance of a secondary battery, accuracy in measurement of the AC impedance of the secondary battery may lower, because various characteristics such as a full charge capacity and an internal resistance may be SOC dependent.

In view of this aspect, in measurement device 210, a sufficiently small value is set for an amplitude of an application signal to be applied to module M. Variation in SOC of the battery module can thus be suppressed and lowering in accuracy in measurement of an AC impedance due to SOC dependency of characteristics can be suppressed. On the other hand, with decrease in amplitude of the application signal, an S/N ratio between the application signal and noise is lowered and influence by noise superimposed on a measurement value of the AC impedance can relatively be great. Consequently, values plotted on a Nyquist diagram may vary as encircled in the figure and accuracy in measurement of the AC impedance may lower.

Depending on a type or a characteristic of module M, results of plotting in a shape as wrapping around as shown in FIG. 5 may be obtained on a Nyquist diagram. In this example, in a frequency region where a frequency f is not lower than 100 mHz and not higher than 100 Hz, a real number component decreases with increase in frequency f. In a region higher in frequency than that region (a frequency region where the frequency is higher than 100 Hz), however, a real number component increases with increase in frequency f. Therefore, in the frequency region where frequency f is higher than 100 Hz, there are two real number components corresponding to one imaginary number component. In general, in such a case, accuracy in fitting processing may lower.

In the present embodiment, such a configuration that a result of measurement of an AC impedance of module M is initially plotted on a Bode diagram (Bode plotting) and fitting processing is performed on the Bode diagram is adopted. By removing noise by the fitting processing and performing prescribed operation (which will be described later) on a curve (polynomial curve) from which noise has been removed, conversion to a curve (an impedance curve) on a Nyquist diagram is performed. This processing will be described below in detail.

Analysis Processing in the Present Embodiment

Referring again to FIG. 4, analyzer 220 is implemented, for example, by a microcomputer including a central processing unit (CPU), a memory, and an input/output port, although none of them is shown, and analyzer 220 analyzes a result of measurement of an AC impedance by measurement device 210. More specifically, analyzer 220 includes plotter 221, a fitting processor 222, a converter 223, a feature value extractor 224, a full charge capacity calculator 225, and a recycle determination unit 226.

Plotter 221 plots a result of measurement of an AC impedance of module M on a Bode diagram based on a signal from potentiostat 212 (a signal representing an amplitude ratio between an application signal and a response signal) and a signal from lock-in amplifier 213 (a signal representing a phase difference between the application signal and the response signal). The Bode plot of module M is output to fitting processor 222.

Figure 6A:
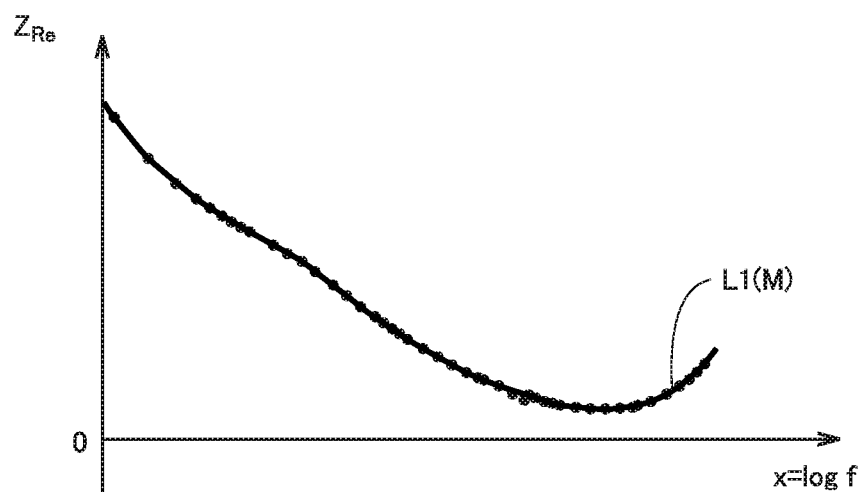
FIGS. 6A and 6B are diagrams showing examples of a Bode plot of a result of measurement of an AC impedance of a module.
Figure 6B:
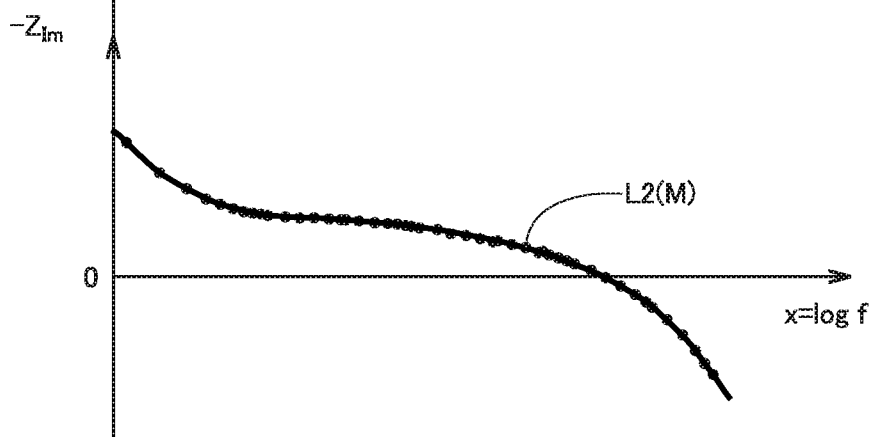

FIGS. 6A and 6B are diagrams showing examples of a Bode plot of a result of measurement of an AC impedance of module M. In FIGS. 6A and 6B, the abscissa represents a logarithm x (x=log f) of frequency f of an AC signal (an application signal) to be applied to module M. The ordinate in FIG. 6A represents a real number component $Z_{Re}$ of a complex impedance of module M and the ordinate in FIG. 6B represents an imaginary number component $-Z_{Im}$ of the complex impedance of module M. FIGS. 6A and 6B each show a plot of a result of measurement of an AC impedance of module M with a black circle. FIG. 6A corresponds to the "first frequency characteristic diagram" according to the present disclosure and FIG. 6B corresponds to the "second frequency characteristic diagram" according to the present disclosure.

Referring back to FIG. 4, curve storage 230 stores two polynomial curves L1 and L2 to be used for fitting processing by fitting processor 222. Polynomial curve L1 can be expressed as in an expression (1) below by way of example.

$$L1: Z_{Re} = a_1 x^3 + b_1 x^2 + c_1 x + d_1 \tag{1}$$

An order in polynomial curve L1 is determined in preliminary experiments. Though the order in polynomial curve L1 is set to three in the expression (1), this is merely by way of example. For example, the order may be set to two or four or more. The same order does not have to be applied to all frequency regions (the entire range on the abscissa x). For example, an order in polynomial curve L1 in a certain frequency region may be set to three and an order of polynomial curve L1 in remaining frequency region may be set to two.

Polynomial curve L2 can also similarly be expressed as in an expression (2) below. An order (and a frequency region) in polynomial curve L2 is also determined in advance similarly to an order (and a frequency region) in polynomial curve L1. Polynomial curves L1 and L2 correspond to the "first polynomial curve" and the "second polynomial curve" according to the present disclosure, respectively.

$$L2: Z_{Im} = a_2 x^3 + b_2 x^2 + c_2 x + d_2 \tag{2}$$

In curve storage 230, a predetermined initial value is set for coefficients $a_1$, $b_1$, $c_1$, and $d_1$ included in polynomial curve L1 and coefficients $a_2$, $b_2$, $c_2$, and $d_2$ included in polynomial curve L2. Curve storage 230 outputs polynomial curves L1 and L2 in which the initial value has been set for each coefficient to fitting processor 222 in response to a request from analyzer 220.

Fitting processor 222 reads polynomial curves L1 and L2 stored in curve storage 230 and subjects each of polynomial curves L1 and L2 to curve fitting (curve regression) so as to be best applied to the Bode plot created by plotter 221 (see FIGS. 6A and 6B). Values of the coefficients (eight coefficients in the example in the expressions (1) and (2)) in polynomial curves L1 and L2 are calculated and polynomial curves L1(M) and L2(M) corresponding to module M are specified. Polynomial curves L1(M) and L2(M) are output to converter 223.

Converter 223 converts polynomial curves L1(M) and L2(M) on the Bode diagram of module M (see FIGS. 6A and 6B) into an impedance curve Z on a Nyquist diagram. More specifically, an impedance curve Z(M) on the Nyquist diagram of module M can be calculated by making the expressions (1) and (2) simultaneous and deleting x (a logarithm of frequency f) as a parameter.

FIG. 7 is a diagram showing one example of impedance curve Z on a Nyquist diagram. FIG. 7 shows a Nyquist plot showing a result of measurement of an AC impedance of module M and impedance curve Z(M) of module M obtained by operation processing by converter 223. It can be understood in FIG. 7 that they well match with each other.

Referring again to FIG. 4, feature value extractor 224 extracts a feature value F(M) from impedance curve Z(M) by performing a prescribed operation on impedance curve Z(M). This operation processing is performed by adopting an equivalent circuit model including an appropriate circuit constant and expressing a frequency characteristic of an AC impedance of module M as will be described below.

Figure 8:
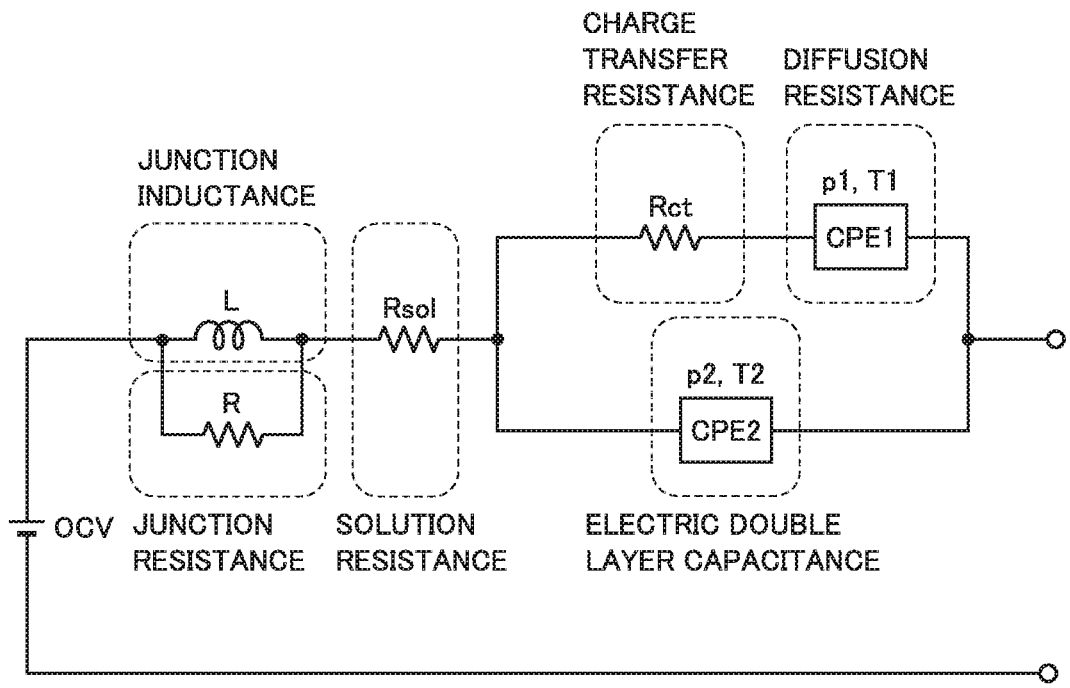
FIG. 8 is a diagram showing an equivalent circuit model of a module in the present embodiment.

FIG. 8 is a diagram showing an equivalent circuit model of a module in the present embodiment. FIG. 9 is a diagram for illustrating a circuit constant included in the equivalent circuit model shown in FIG. 8. Referring to FIGS. 8 and 9, in the present embodiment, an equivalent circuit model representing a frequency characteristic of an AC impedance of a module includes as circuit constants, a junction inductance L, a junction resistance R, a solution resistance Rsol, a charge transfer resistance Rct, a diffusion resistance (denoted as CPE1), and an electric double layer capacitance (denoted as CPE2).

Junction inductance L refers to an inductance component in a portion of junction between cells included in a module (a portion of junction between the positive electrode and the negative electrode). Junction resistance R refers to a resistance component in the junction portion. Solution resistance Rsol refers to a resistance component of an electrolyte solution present between the positive electrode and the negative electrode. Charge transfer resistance Rct refers to a resistance component relating to transfer of charges (supply and reception of charges) at an electrode/electrolyte interface (surfaces of a positive electrode active material and a negative electrode active material). The diffusion resistance refers to a resistance component relating to diffusion of a charge transfer material in salt or an active material in the electrolyte solution. The electric double layer capacitance refers to a capacitance component of an electric double layer formed at an electrode/electrolyte solution interface. Each of these circuit constants results from combination of corresponding components in all cells in the module.

Junction inductance L and junction resistance R are connected in parallel to each other. Solution resistance Rsol is connected in series to a parallel circuit of junction inductance L and junction resistance R. Charge transfer resistance Rct and the diffusion resistance are connected in series to each other. A series circuit of charge transfer resistance Rct and the diffusion resistance and the electric double layer capacitance are connected in parallel to each other. A combined circuit including junction inductance L, junction resistance R, and solution resistance Rsol and a combined circuit including charge transfer resistance Rct, the diffusion resistance, and the electric double layer capacitance are connected in series to each other.

In the present embodiment, in order to appropriately express a capacitive behavior of module M, each of the diffusion resistance and the electric double layer capacitance of the module is expressed by a non-linear element called a constant phase element (CPE). More specifically, an impedance $Z_{CPE1}$ corresponding to the diffusion resistance is expressed as shown in an expression (3) below with a CPE index p1 and a CPE constant T1. In the expression (3), an angular frequency of an AC signal applied to module M (application signal) is denoted as $\omega$ ($\omega=2\pi f$).

$$Z_{CPE1}=1/\{(j\omega)p1 \times T1\} \quad (3)$$

Similarly, an impedance ZCPE2 corresponding to the electric double layer capacitance can also be expressed as shown in an expression (4) below with a CPE index p2 and a CPE constant T2.

$$Z_{CPE2}=1/\{(j\omega)p2 \times T2\} \quad (4)$$

In the present embodiment, the equivalent circuit model including eight circuit constants shown in FIGS. 8 and 9 is thus adopted. A value of each of eight circuit constants is calculated from impedance curve Z(M) of module M obtained by operation processing by converter 223. In addition, a feature value F is extracted from the eight calculated circuit constants, for example, by a statistic approach such as multiple regression analysis.

Which feature value should be extracted to establish correlation between the feature value and a full charge capacity Q of the module is confirmed in advance in experiments. More specifically, relation between feature value F and full charge capacity Q (a full charge capacity measured by actual charging and discharging of the module) of a large number of modules is experimentally found. By way of example, correlation expressed by a linear function as in an expression (5) below is established between feature value F and full charge capacity Q (p being a number other than 0).

$$Q=p \times F+q \quad (5)$$

Referring again to FIG. 4, correlation storage 240 stores correlation between feature value F and full charge capacity Q of a module. Correlation storage 240 is referred to by analyzer 220.

Full charge capacity calculator 225 calculates a full charge capacity corresponding to feature value F(M) of module M by referring to correlation between feature value F and the full charge capacity stored in correlation storage 240. Calculated full charge capacity Q(M) is output to recycle determination unit 226.

Recycle determination unit 226 determines recyclability or a manner of recycle (rebuild or material recycle) of module M in accordance with full charge capacity Q(M) of module M. Specifically, recycle determination unit 226 determines that module M is recyclable (can be used for rebuild) when full charge capacity Q(M) is equal to or higher than a prescribed value and determines that module M is not recyclable (to be passed to material recycle) when full charge capacity Q(M) is lower than the prescribed value. A result of determination by recycle determination unit 226 is output to display 250.

Display 250 is implemented, for example, by a liquid crystal display and shows a result of determination by recycle determination unit 226. The test service provider can thus know how module M should be processed.

Flow of Determination of Manner of Recycle

In succession, a process flow for determining a manner of recycle of module M will be described in detail.

Figure 10:
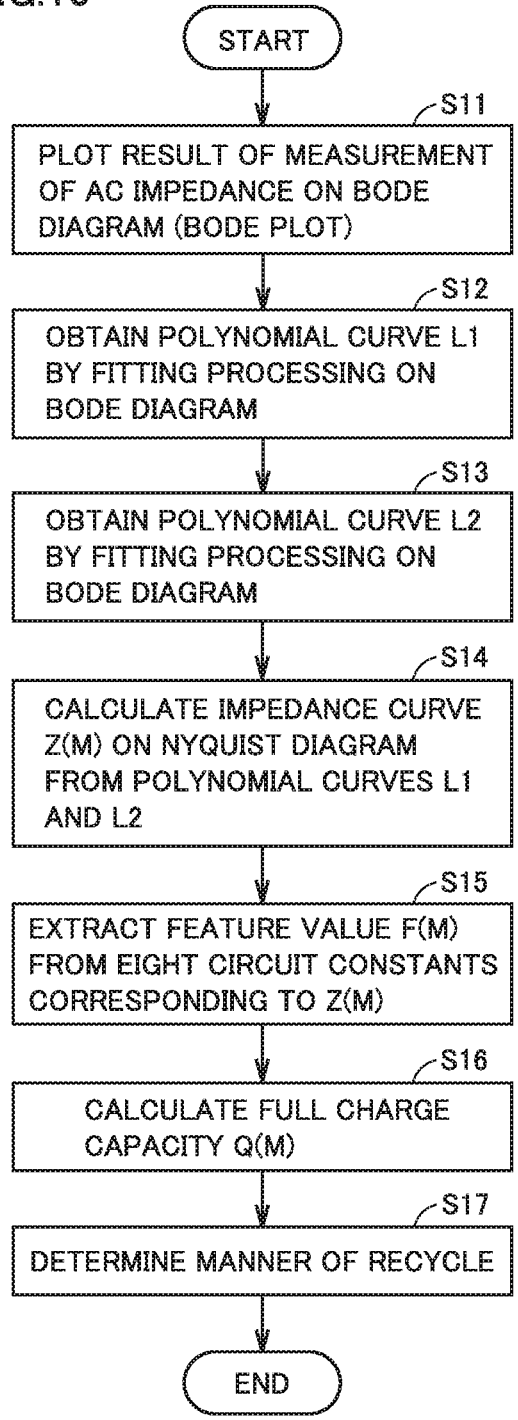
FIG. 10 is a flowchart showing processing for determining a manner of recycle of a module M in the present embodiment.

FIG. 10 is a flowchart showing processing for determining a manner of recycle of module M in the present embodiment. This flowchart is executed by battery information processing system 200, for example, when the test service provider sets module M in battery information processing system 200 and operates a not-shown operation portion (such as a start button).

Components (such as plotter 221 of analyzer 220 or fitting processor 222 of analyzer 220) of battery information processing system 200 as an entity to perform each type of processing are not particularly distinguished below and they are comprehensively denoted as a "processing device 200." Though each step is basically performed by software processing by processing device 200, it may partly or entirely be performed by hardware (an electric circuit) provided in processing device 200.

Referring to FIG. 10, in S11, processing device 200 measures an AC impedance of module M and plots a result of measurement on a Bode diagram (Bode plotting) (see FIGS. 6A and 6B). Since this processing is described in detail with reference to the functional blocks of oscillator 211, potentiostat 212, lock-in amplifier 213, and plotter 221 shown in FIG. 4, description will not be repeated.

In S12, processing device 200 performs fitting processing of polynomial curve L1(M) of module M on the Bode diagram such that an error from a measurement value (a measurement value in S11) of the AC impedance of module M is minimized (see FIG. 6A). In this curve fitting, an initial value is substituted into four coefficients (see the expression (1)) as fitting parameters included in polynomial curve L1 as in curve fitting of a general polynomial curve, and values of the four coefficients are adjusted, for example, by the non-linear least square method until a prescribed convergence condition is satisfied. Four coefficients $a_1$, $b_1$, $c_1$, and $d_1$ are thus determined.

Similarly, in S13, processing device 200 performs fitting processing of polynomial curve L2(M) of module M on the Bode diagram, for example, by the non-linear least square method (see FIG. 6B). Four coefficients $a_2$, $b_2$, $c_2$, and $d_2$ included in polynomial curve L2 are thus determined (see the expression (2)).

In S14, processing device 200 calculates impedance curve Z(M) of module M by deleting a frequency (x or log f) from polynomial curve L1(M) calculated in S12 and polynomial curve L2(M) calculated in S13 (see FIG. 7).

In the present embodiment, the equivalent circuit model including eight circuit constants shown in FIGS. 8 and 9 is adopted. The eight circuit constants in the equivalent circuit model corresponding to module M can be calculated based on impedance curve Z(M) of module M. Processing device 200 extracts feature value F(M) from the eight circuit constants calculated based on impedance curve Z(M) (S15). For example, for some of the eight circuit constants, a feature value can be extracted by multiplying each circuit constant by a weight coefficient greater than that for remaining circuit constants.

When feature value F(M) in impedance curve Z(M) is extracted as set forth above, processing device 200 calculates full charge capacity Q(M) of module M based on extracted feature value F(M) (S16).

Thereafter, processing device 200 determines in S17 a manner of recycle of module M in accordance with full charge capacity Q(M) of module M. For example, processing device 200 calculates a capacity retention which represents a ratio ($=Q(M)/Q_0$) between current full charge capacity Q(M) of module M and an initial full charge capacity $Q_0$ (a value already known from specifications of module M) and compares the capacity retention with a prescribed reference value. When the capacity retention of module M is not lower than the reference value, processing device 200 determines that module M can be used for rebuild of a battery assembly, and when the capacity retention of module M is lower than the reference value, it determines that module M cannot be used for rebuild and resources should be recycled.

Accuracy in Calculating Full Charge Capacity

Accuracy in calculating a full charge capacity by a method of determining a manner of recycle of a module in the present embodiment will finally be described.

Figure 11A:
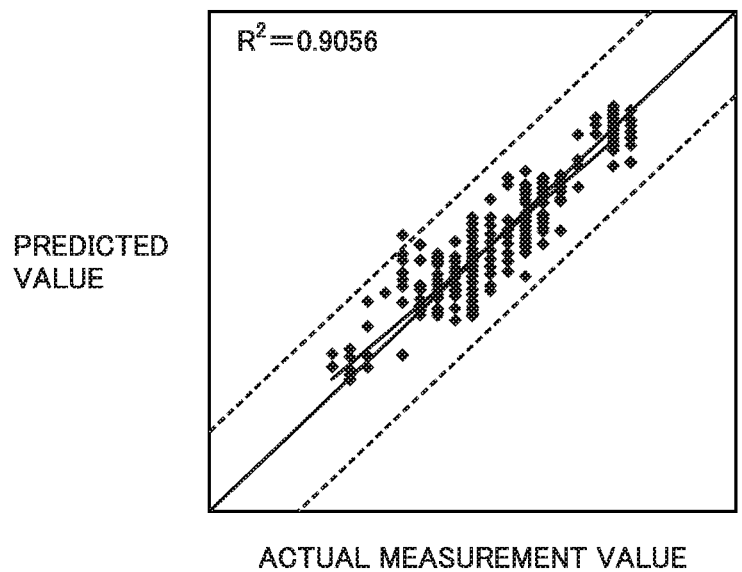
FIGS. 11A and 11B are diagrams for illustrating accuracy in calculating a full charge capacity of a module in the present embodiment.
Figure 11B:
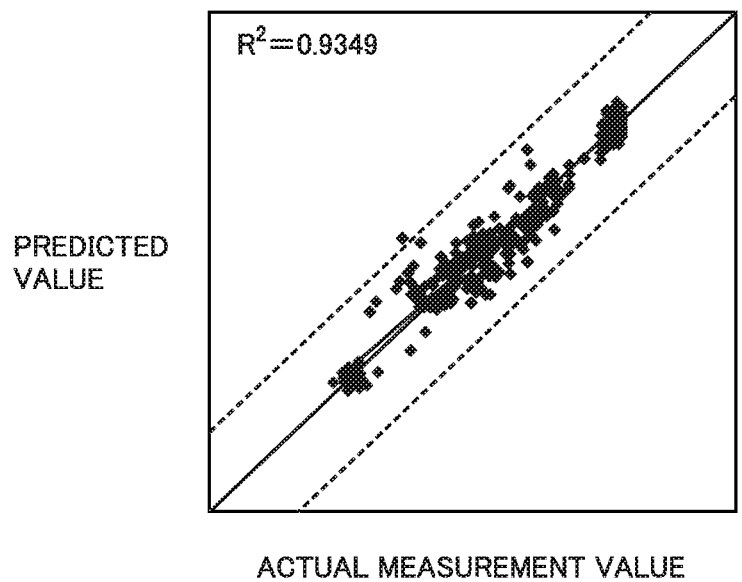

FIGS. 11A and 11B are diagrams for illustrating accuracy in calculating a full charge capacity of a module in the present embodiment. The abscissa in FIGS. 11A and 11B represents an actual full charge capacity of a module. The actual full charge capacity is denoted as an "actual measurement value" in FIGS. 11A and 11B.

The ordinate in FIG. 11A represents a full charge capacity (which is denoted as a "predicted value") of a module calculated in a comparative example. In the comparative example, an impedance curve (eight circuit constants) is obtained by fitting processing on a Nyquist diagram and a full charge capacity of a module is calculated based on the eight circuit constants. The ordinate in FIG. 11B represents a full charge capacity (which is similarly denoted as a "predicted value") of a module calculated by the approach in the present embodiment (that is, the approach described with reference to FIGS. 4 to 10).

In the comparative example, a correlation coefficient $R^2$ between the actual measurement value and the predicted value of the full charge capacity is 0.9056 (see FIG. 11A). In contrast, in the present embodiment, correlation coefficient $R^2$ increases to 0.9349 as shown in FIG. 11B by lessening influence by noise by fitting processing on a Bode diagram. Namely, correlation between the actual measurement value and the predicted value of the full charge capacity becomes higher. Thus, according to the present embodiment, improvement in accuracy in calculating a full charge capacity of a module is confirmed.

Thus, in the present embodiment, a result of measurement of an AC impedance of module M is plotted on a Bode diagram. On the Bode diagram, a real number component and an imaginary number component of the AC impedance of module M are separately subjected to fitting processing (see FIGS. 6A and 6B). Thus, polynomial curve L1 representing a frequency characteristic of the real number component of the AC impedance and polynomial curve L2 representing a frequency characteristic of the imaginary number component of the AC impedance are obtained and impedance curve Z(M) on the Nyquist diagram is calculated from thus obtained polynomial curves L1 and L2 (see FIG. 7).

A frequency of a signal applied to module M (an application signal) at the time of measurement of an AC impedance of module M has already been known. Therefore, for example, when an S/N ratio between the application signal and noise is low and influence by noise is unignorable, hunting of a plotted value affected by noise occurs in both of a direction of the ordinate and a direction of the abscissa on a Nyquist diagram (the plotted value deviates from a normal value) and it is difficult to correct influence by hunting.

In contrast, on a Bode diagram, an error is less likely to occur in the direction of the abscissa (a direction of a frequency) and the error is produced mainly in the direction of the ordinate. Therefore, by appropriately setting an order in polynomial curves L1 and L2 on the Bode diagram based on results in preliminary experiments, an error produced in the direction of the ordinate can sufficiently be lessened by fitting processing of polynomial curves L1 and L2. By thus performing operation processing (processing for calculating polynomial curves L1 and L2) on the Bode diagram prior to calculation of impedance curve Z(M) on a Nyquist diagram, influence by noise can be lessened and lowering in accuracy in measurement of an AC impedance can be suppressed. Consequently, full charge capacity Q(M) of module M can highly accurately be estimated.

Superimposition on the application signal, of noise at a specific frequency generated from a noise source (such as another apparatus or a power supply) located outside battery information processing system 200 may lower accuracy in measurement of an AC impedance. Even in such a case, however, values plotted at frequencies around the specific frequency exhibit normal values on the Bode diagram and only a value plotted at the specific frequency exhibits an abnormal value as being affected by noise. Therefore, an abnormal value plotted at the specific frequency can readily be corrected under the influence by many normal plot values.

Furthermore, even though a result of plotting in such a shape as wrapping around is obtained on a Nyquist diagram as shown in FIG. 5, the result does not exhibit such a shape on a Bode diagram. Therefore, since normal fitting processing of a function (a curve in which there is only a single value in the direction of the ordinate corresponding to a single value in the direction of the abscissa) should only be performed on the Bode diagram, accuracy in fitting processing can also be improved.

As set forth above, according to the present embodiment, lowering in accuracy in measurement of an AC impedance can be suppressed. Therefore, full charge capacity Q(M) of module M can highly accurately be evaluated.

Though the embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A battery information processing system which processes information on a characteristic of a battery module including a plurality of secondary batteries, the battery information processing system comprising:
an analyzer configured to analyze a result of measurement of an AC impedance of the battery module; and
a storage configured to store correlation between a plurality of circuit constants and the characteristic, the plurality of circuit constants being included in an equivalent circuit model expressing the AC impedance,
the analyzer being configured to
plot the result of measurement of the AC impedance on a first frequency characteristic diagram and a second frequency characteristic diagram, the first frequency characteristic diagram being a Bode diagram relating to a real number component of the AC impedance, the second frequency characteristic diagram being a Bode diagram relating to an imaginary number component of the AC impedance,
obtain a first polynomial curve by fitting processing onto a result of plotting on the first frequency characteristic diagram and obtain a second polynomial curve by fitting processing onto a result of plotting on the second frequency characteristic diagram,
convert the first and second polynomial curves into an impedance curve on a Nyquist diagram relating to the real number component and the imaginary number component of the AC impedance, and
extract the plurality of circuit constants from the impedance curve and evaluate the characteristic based on the plurality of extracted circuit constants by referring to the correlation.

2. The battery information processing system according to claim 1, wherein
each of the plurality of secondary batteries is a nickel metal hydride battery, and
the characteristic of the battery module is at least one of a full charge capacity and an internal resistance of the battery module.

3. A battery assembly comprising:
a plurality of the battery modules of which characteristic has been evaluated by the battery information processing system according to claim 1.

4. The battery information processing system according to claim 1, wherein the measurement of the AC impedance of the battery module comprises measurements spread across a range of AC frequencies.

5. The battery information processing system according to claim 1, wherein the first and second frequency characteristic diagrams represent a frequency response of the battery module over a range of frequencies.

6. A method of evaluating a characteristic of a battery module including a plurality of secondary batteries, correlation between the characteristic and a plurality of circuit constants being established, the plurality of circuit constants being included in an equivalent circuit model expressing an AC impedance of the battery module, the method comprising:
plotting a result of measurement of the AC impedance on a first frequency characteristic diagram and a second frequency characteristic diagram, the first frequency characteristic diagram being a Bode diagram relating to a real number component of the AC impedance, the second frequency characteristic diagram being a Bode diagram relating to an imaginary number component of the AC impedance;
obtaining a first polynomial curve by fitting processing onto a result of plotting on the first frequency characteristic diagram and obtaining a second polynomial curve by fitting processing onto a result of plotting on the second frequency characteristic diagram;
converting the first and second polynomial curves into an impedance curve on a Nyquist diagram relating to the real number component and the imaginary number component of the AC impedance; and extracting the plurality of circuit constants from the impedance curve and evaluating the characteristic based on the plurality of extracted circuit constants by referring to the correlation.

7. The method of evaluating a characteristic of a battery module according to claim 6, wherein the measurement of the AC impedance of the battery module comprises measurements spread across a range of AC frequencies.

8. The method of evaluating a characteristic of a battery module according to claim 6, wherein the first and second frequency characteristic diagrams represent a frequency response of the battery module over a range of frequencies.

9. A method of manufacturing a battery assembly, correlation between a plurality of circuit constants included in an equivalent circuit model expressing an AC impedance of a battery module and a characteristic of the battery module being established, the battery module including a plurality of secondary batteries, the method comprising:

plotting a result of measurement of the AC impedance on a first frequency characteristic diagram and a second frequency characteristic diagram, the first frequency characteristic diagram being a Bode diagram relating to a real number component of the AC impedance, the second frequency characteristic diagram being a Bode diagram relating to an imaginary number component of the AC impedance;

obtaining a first polynomial curve by fitting processing onto a result of plotting on the first frequency characteristic diagram and obtaining a second polynomial curve by fitting processing onto a result of plotting on the second frequency characteristic diagram;

converting the first and second polynomial curves into an impedance curve on a Nyquist diagram relating to the real number component and the imaginary number component of the AC impedance;

extracting the plurality of circuit constants from the impedance curve and evaluating the characteristic based on the plurality of extracted circuit constants by referring to the correlation; and manufacturing the battery assembly from a plurality of battery modules of which characteristic has been evaluated in the evaluating the characteristic.

10. The method of manufacturing a battery module according to claim 9, wherein the measurement of the AC impedance of the battery module comprises measurements spread across a range of AC frequencies.

11. The method of manufacturing a battery module according to claim 9, wherein the first and second frequency characteristic diagrams represent a frequency response of the battery module over a range of frequencies.

* * * * *